United States Patent
Funasaka (10) Patent No.: US 7,245,193 B2
(45) Date of Patent: Jul. 17, 2007

(54) SURFACE ACOUSTIC WAVE ELEMENT AND ELECTRONIC EQUIPMENT PROVIDED WITH THE ELEMENT

(75) Inventor: Tsukasa Funasaka, Shiojiri (JP)

(73) Assignee: Seiko Epson Corporation (JP)

( * ) Notice: Subject to any disclaimer, the term of this patent is extended or adjusted under 35 U.S.C. 154(b) by 74 days.

(21) Appl. No.: 10/925,881

(22) Filed: Aug. 25, 2004

(65) Prior Publication Data

US 2005/0077982 A1 Apr. 14, 2005

(30) Foreign Application Priority Data

Aug. 29, 2003 (JP) ............................. 2003-307371

(51) Int. Cl.
*H03H 9/00* (2006.01)
*H03H 9/15* (2006.01)
(52) U.S. Cl. ...................................... 333/193; 333/195
(58) Field of Classification Search ................ 333/193, 333/195; 310/313 A, 313 B, 313 D
See application file for complete search history.

(56) References Cited

U.S. PATENT DOCUMENTS

| | | | |
|---|---|---|---|
| 5,719,538 A | 2/1998 | Kadota | 333/193 |
| 6,172,581 B1 | 1/2001 | Tanaka | 333/194 |
| 6,255,916 B1 | 7/2001 | Nakamura et al. | 333/195 |
| 6,466,108 B2 * | 10/2002 | Matsuda et al. | 333/193 |
| 6,469,416 B1 * | 10/2002 | Itakura et al. | 310/313 A |
| 6,593,679 B2 * | 7/2003 | Higuchi et al. | 310/313 A |
| 6,812,812 B2 | 11/2004 | Hiramoto | 333/195 |
| 6,903,630 B2 * | 6/2005 | Miura et al. | 333/193 |

FOREIGN PATENT DOCUMENTS

| | | |
|---|---|---|
| DE | 44 08 989 A1 | 3/1994 |
| EP | 0 435 189 A2 | 12/1990 |
| JP | 7-73177 | 3/1995 |
| JP | 2000-49558 A | 2/2000 |
| JP | 2000-201053 A | 7/2000 |
| KR | 10-0200410 | 6/1999 |

OTHER PUBLICATIONS

Communication from European Patent Office re: related application.

* cited by examiner

*Primary Examiner*—Dean Takaoka
(74) *Attorney, Agent, or Firm*—Harness, Dickey & Pierce, P.L.C.

(57) ABSTRACT

A surface acoustic wave element 1 includes a substrate 2, an intermediate layer and a piezoelectric layer 4 laminated on the substrate 2, an IDT 5 disposed on the piezoelectric layer 4, a pair of reflectors 6 and 7 arranged on both sides of the IDT 5, and a protective layer 8 provided so as to cover the IDT 5 and the reflectors 6 and 7. The IDT 5, that is each of the electrode 5a and 5b, has a plurality of electrode fingers 51 juxtaposed with a prescribed spacing and the reflectors 6 and 7 have respectively a plurality of reflecting bodies 61 and 71. Further, the pitch Pr of the reflecting body of each reflector 6 and 7 is set to be smaller than the pitch Pt of the electrode finger of the IDT 5 and the ratio Pr/Pt is preferably set to be in the range of 0.7 to 0.9995. According to the surface acoustic wave element 1, the impedance characteristic and the insertion loss can be improved. Furthermore, electronic equipment having such surface acoustic wave element is provided.

10 Claims, 9 Drawing Sheets

Frequency Deviation with Respect to the Reference Frequency (ppm)

SURFACE ACOUSTIC WAVE ELEMENT AND ELECTRONIC EQUIPMENT PROVIDED WITH THE ELEMENT

BACKGROUND OF THE INVENTION

1. Field of the Invention

The present invention relates to a surface acoustic wave element and electronic equipment provided with the element.

2. Description of the Prior Art

A wave which is propagated by concentrating its energy in the vicinity of the surface of a propagation medium is known as a Surface Acoustic Wave (SAW).

A surface acoustic wave element is a device utilizing such a surface acoustic wave. The surface acoustic wave element is used in a band pass filter for communication equipment such as a mobile telephone, a resonator as a reference clock, a delay element for signal processing (in particular, a fourier transform functional element), various kinds of sensors such as a pressure sensor and a temperature sensor, an optical deflector, and the like.

A surface acoustic wave element used as a filter or a resonator, for example, comprises a piezoelectric base body as the propagation medium of the surface acoustic wave, a pair of interdigital transducers (ITDs) arranged on the piezoelectric base body, one for input which applies a voltage to excite a surface acoustic wave in the piezoelectric base body, and another for output which detects a surface acoustic wave propagating on the piezoelectric base body and outputs the wave by converting it into an electrical signal, and a pair of reflectors arranged on both sides of the combined IDTs. The IDTs and the reflectors are respectively formed from a layer of conductive material such as Aluminum.

In the surface acoustic wave element, when an AC power (electrical signal) is supplied to the input IDT, a strain is generated in the piezoelectric base body due to the electric field caused by the AC power. At this time, high and low density pattern is created in the piezoelectric base body because of the interdigital structure of the electrodes that generate the electric field, and as a result, surface acoustic waves are generated.

The generated surface acoustic wave propagates on both sides of the IDT, and then it is reflected by the reflectors, which gives rise to a resonance in the space between the reflectors. The energy of the surface acoustic wave is converted into electrical energy by the output IDT, and it is outputted from the output IDT.

When the surface acoustic wave element is used in a resonator or in a filter, the factors which determine the impedance characteristic of the resonator and the insertion loss in the filter include an electrode finger pitch Pt of the IDT and a reflecting body pitch Pr of the reflector.

In general, the electrode finger pitch Pt and the reflecting body pitch Pr are set respectively to about one half of the wavelength $\lambda$ of the surface acoustic wave. When the thickness of the IDT and the reflector is small or the specific gravity of the constituent materials of these components is relatively low, it is possible to match the frequency of the surface acoustic wave of the IDT and the frequency of the surface acoustic wave of the reflectors by setting the electrode finger pitch Pt to be equal to the reflecting body pitch Pr, thereby enabling the impedance characteristic and the insertion loss to be improved.

However, there exist optimum values of the thickness of the IDT and the reflector in response to their required functions. For example, when a high reflectance of the surface acoustic waves of the IDT and by the reflector is desired, it is preferred that the thickness of the IDT and the reflector is relatively large.

However, when the thickness of the IDT and the reflector is made large, matching of the frequency of the surface acoustic wave of the IDT and the frequency of the surface acoustic wave of the reflector tends to be lost. As a result, a phenomenon in which the impedance characteristic and the insertion loss are likely to be impaired can be seen.

Such a phenomenon becomes particularly conspicuous when a material with relatively high specific gravity is used as the constituent material for the IDT and the reflector.

Under these circumstances, there has been proposed a surface acoustic wave element which can provide a satisfactory resonance performance by setting the electrode finger pitch Pt to be smaller than the reflecting body pitch Pr even in the case where the IDT and the reflector are configured so that their reflectance become high (see, for example, Japanese Patent Publication No. H7-73177).

However, depending upon the configuration of the piezoelectric base body, there arises a case in which no sufficient improvement in the impedance characteristic and insertion loss of the surface acoustic wave element cannot be obtained even when the configuration described in the prior art is applied.

SUMMARY OF THE INVENTION

The present invention has been made in view of the problem in the prior art described above, and therefore it is an object of the present invention to provide a surface acoustic wave element employing a substrate having a piezoelectric layer by which it is possible to improve the impedance characteristic and the insertion loss of the element, and an electronic equipment provided with the surface acoustic wave element.

In order to achieve the above object, the present invention is directed to a surface acoustic wave element, which comprises a substrate; a piezoelectric layer arranged on the substrate and mainly formed of a piezoelectric material; an interdigital transducer arranged on the piezoelectric layer for converting an electrical signal into a surface acoustic wave and/or for converting a surface acoustic wave into an electrical signal, and the interdigital transducer including a plurality of electrode fingers juxtaposed with a prescribed spacing; and a reflector arranged adjacent to the interdigital transducer on the piezoelectric layer, the first reflector including a plurality of reflecting bodies juxtaposed with a prescribed spacing, wherein a pitch of the reflecting body of the reflector is made to be smaller than a pitch of the electrode finger of the interdigital transducer.

According to the surface acoustic wave element having the above structure, it is possible to improve the impedance characteristic and the insertion loss of the acoustic wave element employing the substrate having the piezoelectric layer.

In the present invention, it is preferred that when the pitch of the electrode finger of the interdigital transducer and the pitch of the reflecting body of the reflector are defined as Pt [μm] and Pr [μm], respectively, the ratio Pr/Pt is in the range of 0.7 to 0.9995. This makes it possible to improve the impedance characteristic and the insertion loss of the element more reliably.

Further, it is also preferred that a thickness of the piezoelectric layer is equal to or less than twice a wavelength of the surface acoustic wave to be excited in the piezoelectric layer. The present invention is especially preferably applied to the surface acoustic wave element having such a thickness.

In the present invention, it is also preferred that the surface acoustic wave element further comprises an intermediate layer which is provided between the piezoelectric layer and the substrate for setting the characteristics of the surface acoustic waves excited in the piezoelectric layer. This makes it possible to set the characteristic of the surface acoustic wave to a desired characteristic.

Further, in the present invention, it is also preferred that the intermediate layer is formed of a material which contains as a major component thereof at least one material selected from the group comprising diamond, sapphire, alumina, silicon, silicon nitride, glass, crystalline quartz, lithium tantalate and potassium niobate. Formation of the intermediate layer from such a material makes it possible to contribute to realizing surface acoustic waves of high frequencies that are required in the high-speed communications fields such radio frequency LANs or optical communications.

Furthermore, it is also preferred that the piezoelectric layer is formed of a material which contains as a major component thereof at least one material selected from the group comprising zinc oxide, aluminum nitride, lithium tantalate, lithium niobate and potassium niobate. Formation of the intermediate layer from such a material makes it possible to obtain a surface acoustic wave element of high frequency type and having excellent heat resistance.

In the present invention, it is preferred that the separation distance between the interdigital transducer and the reflector is in the range of 0.05 to 0.4 time the wavelength of the surface acoustic wave excited in the piezoelectric layer or the sum of this value and an integer multiple of the wavelength. This makes it possible for the reflector to perform resonance of surface acoustic waves efficiently.

Further, it is also preferred that the surface acoustic wave element further comprises a second reflector, wherein the reflector and the second reflector are arranged on both sides of the interdigital transducer on the piezoelectric layer. This makes it possible to confine the surface acoustic waves therebetween to resonate them.

Furthermore, it is also preferred that the configuration of the second reflector is substantially the same as the configuration of the reflector. This also makes it possible to confine the surface acoustic waves therebetween to resonate them more dynamically.

Another aspect of the present invention is directed to an electronic equipment provided with the surface acoustic wave element as described above.

The above and other objects, structures and advantages of the present invention will be more apparent when the following description of the preferred embodiments will be considered taken in conjunction with the accompanying drawings.

DETAILED DESCRIPTION OF THE PREFERRED EMBODIMENTS

Hereinbelow, the preferred embodiments of the surface acoustic wave element and the electronic equipment provided with the surface acoustic wave element according to the present invention will be described.

First Embodiment

Figure 1:
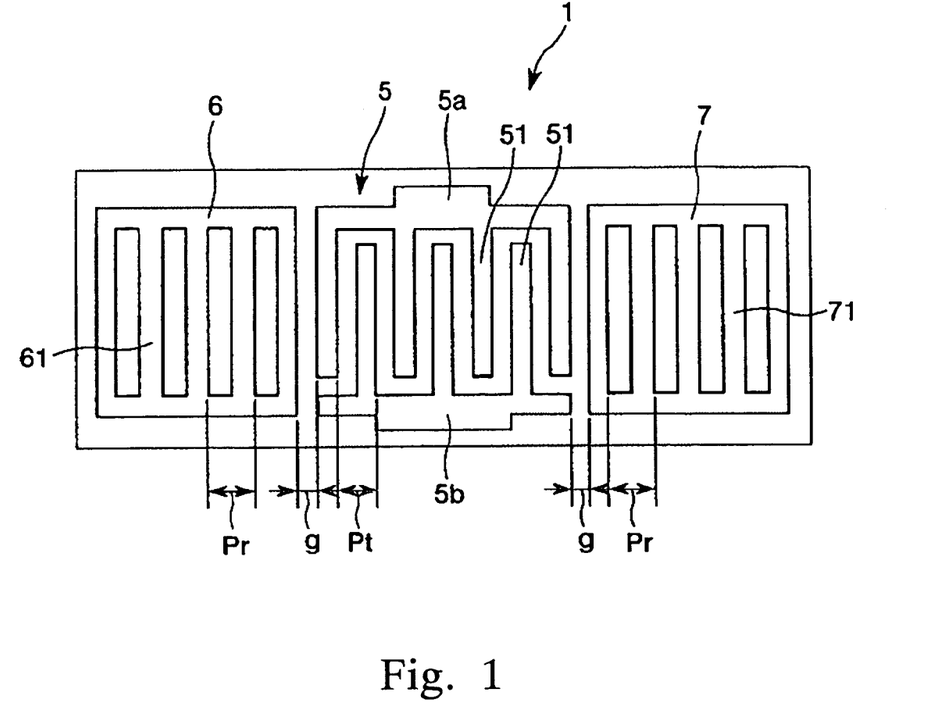
FIG. 1 is a plane view showing a first embodiment of the surface acoustic wave element according to the present invention.
Figure 2:
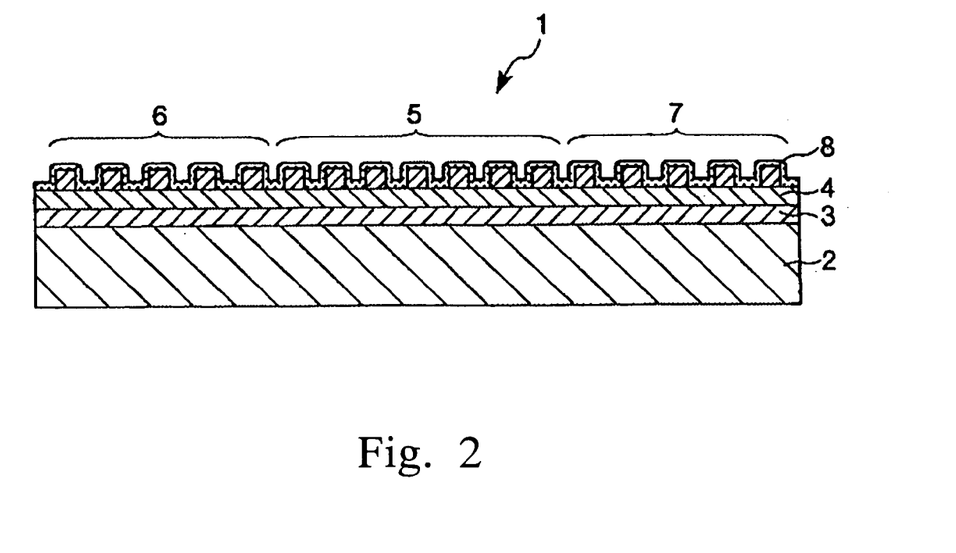
FIG. 2 is a sectional view of the surface acoustic wave element shown in FIG. 1.

FIG. is a plan view showing a first embodiment of the surface acoustic wave element according to the present invention, and FIG. 2 is a sectional view of the surface acoustic wave element shown in FIG. 1. In the following description, the upper and the lower sides of FIG. 2 will be referred to as "upper" and "lower," respectively.

A surface acoustic wave element 1 shown in each of the drawings comprises a substrate 2, an intermediate layer 3 and a piezoelectric layer 4 which are laminated on the substrate 2, an IDT 5 disposed on the piezoelectric layer 4, a pair of reflectors 6 and 7 arranged on both sides of the IDT 5, and a protective layer 8 provided so as to cover the IDT 5 and the reflectors 6 and 7.

Examples of a constituent material for the substrate 2 include various kinds of semiconductor material such as Si, GaSi, SiGe, GaAs, STC and InP, crystalline quartz, various kinds of glass material, various kinds of ceramic material, various kinds of resin material such as polyimide and polycarbonate, and the like.

Although the average thickness of the substrate 2 is not particularly limited, but it is preferably in the range of 0.05 to 1 mm, and more preferably in the range of 0.1 to 0.8 mm.

The substrate 2 may be formed into a single layer or into a laminate of several layers. In the latter case, materials described in the above may be selectively used for each of the layers in an arbitrary combination.

The intermediate layer 3 is provided between the piezoelectric layer 4 and the substrate 2, and has a function of setting the characteristics (regulating the conditions) of the surface acoustic waves excited in the piezoelectric layer 4. As for the characteristics, the oscillation frequency, amplitude, propagation velocity, and the like can be mentioned.

By providing the intermediate layer 3 formed of an appropriately selected constituent material, the characteristics of the surface acoustic waves may be set to desired levels. As the constituent material of the intermediate layer 3, it is preferable to employ a material which contains as a major component thereof at least one material selected from the group comprising diamond, sapphire, alumina, silicon, silicon nitride, glass, crystalline quartz, quartz, lithium tantalite, and potassium niobate, and the like. Especially, it is preferable to employ a material which contains as major component thereof at least one material selected from among diamond, sapphire, lithium tantalite, and potassium niobate. By constituting the intermediate layer 3 with such a material, it is possible to contribute to realizing surface acoustic waves of high frequencies that are required in the high-speed communications fields such radio frequency LANs or optical communications.

Although the optimum average thickness of the intermediate layer 3 may have varying values depending upon the frequency and the desired characteristics, it is preferably in the range of 1 to 20 μm, more preferably in the range of 3 to 10 μm, and even more preferably in the range of 3 to 5 μm.

The intermediate layer 3 may be formed into a single layer or a laminate structure formed of a plurality of layers in accordance with the characteristics of the required surface acoustic wave. In this regard, it is to be noted that the intermediate layer 3 is provided in accordance with a special need, so that normal operation can be done without it.

The piezoelectric layer 4 functions as the propagation medium of the surface acoustic wave.

As the constituent material for the piezoelectric layer 4, it is preferable to use a material which contains as a major component thereof at least one material which is selected from among zinc oxide, aluminum nitride, lithium tantalate, lithium niobate, and potassium niobate. By constituting the piezoelectric layer 4 using such a material, it is possible to obtain a surface acoustic wave element 1 that is of high frequency and has an excellent temperature characteristic. Moreover, when the substrate 2 is a piezoelectric substrate, it is possible to obtain a surface acoustic wave element that has a piezoelectric characteristic in both of the substrate 2 and the piezoelectric layer 4.

Although the thickness of the piezoelectric layer 4 varies somewhat depending upon the constituent material or the like of the piezoelectric layer 4 and hence is not particularly limited to a specific value, it is preferable that the thickness is less than twice the wavelength of the surface acoustic wave excited in the piezoelectric layer 4, and more preferably in the range of 0.01 to 1 time the wavelength. If the thickness of the piezoelectric layer 4 is too small, there is a possibility that a surface acoustic wave may not be excited. On the other hand, if the thickness of the piezoelectric layer 4 is too large, there is a possibility that the effect of the present invention that will be described later may not be realized.

The IDT is of the so-called one-port type, and has electrodes 5a and 5b that possess a function of exciting a surface acoustic wave in the piezoelectric layer 4 when a voltage is applied to the piezoelectric layer 4. Besides, in the present embodiment, each of the electrodes 5a and 5b also has the function of converting the surface acoustic wave into an electrical signal.

Moreover, each of the reflectors 6 and 7 possesses the function of reflecting the surface acoustic wave that propagates in the piezoelectric layer 4, and confining it in the space between the reflectors 6 and 7.

When a drive voltage is inputted to the IDT 5 (each electrode 5a and 5b), a surface acoustic wave is excited in the piezoelectric layer 4, and an electrical signal with a specific frequency due to resonance is outputted from the IDT 5 (each electrode 5a and 5b).

The electrodes 5a and 5b have respectively a plurality of electrode fingers 51 juxtaposed with a prescribed spacing, and form an interdigital structure as a whole.

The reflectors 6 and 7 have respectively a plurality of reflecting bodies (teeth) 61 and 71, juxtaposed with a prescribed spacing, forming as a whole a comb-shaped structure, respectively. In this way, each of the reflectors 6 and 7 is configured so as to be able to reflect the surface acoustic wave with high efficiency.

By adjusting the width, spacing, pitch, thickness, and the like of the electrode fingers 51 and the reflecting bodies 61 and 71, it is possible to set the characteristics such as the oscillation frequency of the surface acoustic wave to desired values. The specific conditions for these quantities will be described in detail later.

The configuration of each of the reflectors 6 and 7 may be made mutually the same or different, but by giving substantially the same configuration to the both reflectors, the surface acoustic wave can be confined more reliably between the reflector 6 and the reflector 7. As a result, it is possible to make the surface acoustic wave resonate more strongly.

As the respective constituent materials for both components of the IDT 5 and the reflectors 6 and 7, Al, Cu, W, Mo, Ti, Au, Ta, Ni, Cr and Ge, and the like, or alloys including these elements may be mentioned, and one kind or two or more kinds of these materials in combination may be used.

The protective layer 8 is provided for preventing adherence of foreign matters to the surface of the IDT 5 and the reflectors 6 and 7, and for preventing short-circuit between the electrode fingers via foreign matters.

As the constituent material for the protective layer 8, it is preferable to use a material which contains as a major component thereof at least one of silicon oxide, silicon nitride and aluminum oxide. By constituting the protective layer 8 using such a material, it is possible to form the protective layer 8 easily, and make the protective layer 8 excellent in insulation as well.

The protective layer 8 may be formed so as to cover the entire surface of the IDT 5 and the reflectors 6 and 7 as shown in FIG. 2, but it may be formed on the upper surface of the IDT 5 and the reflectors 6 and 7 corresponding to their patterns, with the side faces of the IDT 5 and the reflectors 6 and 7 exposed to the air. With such an arrangement, energy loss generated during the propagation of the surface acoustic wave can be suppressed to a low level.

Moreover, the protective layer 8 also functions for correcting the temperature characteristic, for which an optimum value is set by finding the temperature characteristics of the piezoelectric layer and the intermediate layer.

Although the average thickness of the protective layer 8 is not particularly limited, it is preferable that the thickness is in the range of 10 to 1,500 nm, and more preferably in the range of 30 to 400 nm. By restricting the thickness of the protective layer 8 to the above range, it is possible to achieve sufficient insulation and obtain satisfactory temperature characteristic while preventing or suppressing lowering of the oscillation frequency of the surface acoustic wave accompanying the increase in the mass.

Next, the configuration of the IDT 5 and the reflectors 6 and 7 constituting the surface acoustic wave element 1 will be described in detail.

As described in the above, the IDT 5 (each of the electrodes 5a and 5b) has a plurality of electrode fingers 51 juxtaposed with a prescribed spacing, and the reflectors 6 and 7 have respectively a plurality of reflecting bodies (teeth) 61 and 71 juxtaposed with a prescribed spacing.

In this invention, the pitch Pr of the reflecting body of each reflector 6 and 7 is set to be smaller than the pitch Pt of the electrode finger of the IDT 5.

With this structure, even when the thickness of the IDT 5 and each of the reflectors 6 and 7 is set relatively large, or even when they are formed of a material with a relatively high specific gravity, it is possible to bring the frequency of the surface acoustic wave at the IDT 5 and the frequency of the surface acoustic wave at each of the reflectors 6 and 7 almost equal, and achieve a satisfactory impedance characteristic and an improvement of insertion loss for the surface acoustic wave element 1. This is resulted from the following reason.

Figure 3:
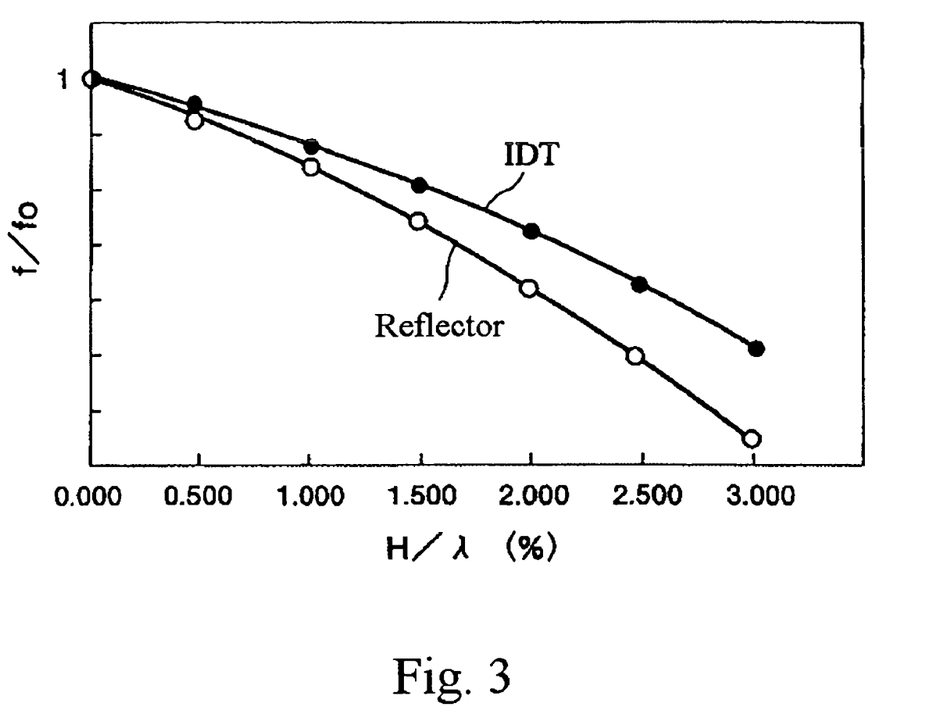
FIG. 3 is a graph showing the relation between the frequencies of the surface acoustic wave at the IDT and at the reflector between the film thickness of the IDT and the reflector.

Here, a graph showing the dependence (relation) between the frequencies of the surface acoustic wave at the IDT and at the reflector and the film thickness of the IDT and the reflector is shown in FIG. 3. In FIG. 3, the abscissa represents the normalized value obtained by dividing the film thickness H of the IDT or each reflector 6 and 7 by the wavelength λ of the surface acoustic wave, and the ordinate represents the normalized value obtained by dividing the frequency f of the surface acoustic wave at the IDT or at the reflector 6 and 7 by the frequency f0 of the surface acoustic wave at H/λ=0. The IDT and the reflectors 6 and 7 are formed of Al, respectively.

As shown in FIG. 3, both of the frequencies f/f0 of the surface acoustic waves at the IDT 5 and at respective reflectors 6 and 7 decrease as H/λ increases, with the decreasing rate for the reflectors 6 and 7 being the larger. Because of this, the difference between the frequency of the surface acoustic wave at the IDT 5 and the frequency of the surface acoustic wave at the reflectors 6 and 7 increases as H/λ gets large.

In the meantime, the respective frequencies f of the surface acoustic waves at the IDT 5 and at the reflectors 6 and 7 are determined respectively based on the following Eq. (I), wherein V is the propagation velocity of the surface acoustic wave and Pt is the pitch of the electrode fingers 51 and Pr is the pitch of the reflecting bodies 61 and 71.

$$f = V/2P \qquad (I)$$

As shown by the equation, the frequencies f of the surface acoustic waves at the IDT 5 and at the reflectors 6 and 7 become high as the electrode finger pitch Pt and the reflecting body pitch Pr decrease.

Accordingly, by setting the reflecting body pitch Pr smaller than the electrode finger pitch Pt, the frequency decrease curve of the surface acoustic wave at the reflectors 6 and 7, as shown in the graph in FIG. 3, is shifted upward, and the difference between the frequency of the surface acoustic wave at the IDT 5 and the frequency of the surface acoustic wave at the reflectors 6 and 7 becomes small. As a result, an improvement in the impedance characteristic and the insertion loss can be achieved in the surface acoustic wave element 1.

Moreover, the improvement on the impedance characteristic and the insertion loss can be achieved by setting the relationship between the electrode finger pitch Pt and the reflecting body pitch Pr as in the above, while aiming at improvement in various characteristics of the surface acoustic wave element 1 by enhancing the reflectance through increase in the film thickness of the IDT 5 and the reflectors 6 and 7, and forming the IDT 5 and the reflectors using a material (for example, gold, chromium, tungsten, titanium, copper or the like) having a relatively high specific gravity. In this manner, the number of the electrode fingers 51 and the number of the reflecting bodies 61 and 71 can be reduced, and as a result, reduction in size of the surface acoustic wave element 1 can be realized.

When the electrode finger pitch of the IDT 5 and the reflecting body pitch of the reflectors 6 and 7 are defined as Pt [μm] and Pr [μm] respectively, it is preferable that the ratio Pr/Pt is in the range of 0.7 to 0.9995, and more preferably in the range of 0.8 to 0.99. By setting the ratio Pr/Pt in the above range, it is possible to reduce the difference between the frequency of the surface acoustic wave at the IDT 5 and the frequency of the surface acoustic wave at the respective reflectors 6 and 7 to a sufficiently low level. As a result, it is possible to improve the impedance characteristic and the insertion loss of the surface acoustic wave element 1 more reliably.

Although the average thickness of the IDT 5 and the reflectors 6 and 7 varies somewhat depending upon the functions desired of the surface acoustic wave element 1, it is preferable that it is in the range of 10 to 2,000 nm.

Moreover, the separation distance g between the IDT 5 and the respective reflectors 6 and 7 is preferably in the range of 0.05 to 0.4 time the wavelength of the surface acoustic wave excited in the piezoelectric layer 4 or the sum of this value and an integer multiple of the wavelength, and more preferably in the range of 0.2 to 0.3 time the wavelength or the sum of this value and an integer multiple of the wavelength. With this setting, it is possible to reduce the shift between the phase of the surface acoustic wave at the IDT 5 and the phase of the surface acoustic wave at the respective reflectors 6 and 7, and as a result, the resonance of the surface acoustic wave by the reflectors 6 and 7 can be performed more efficiently.

Figure 4:
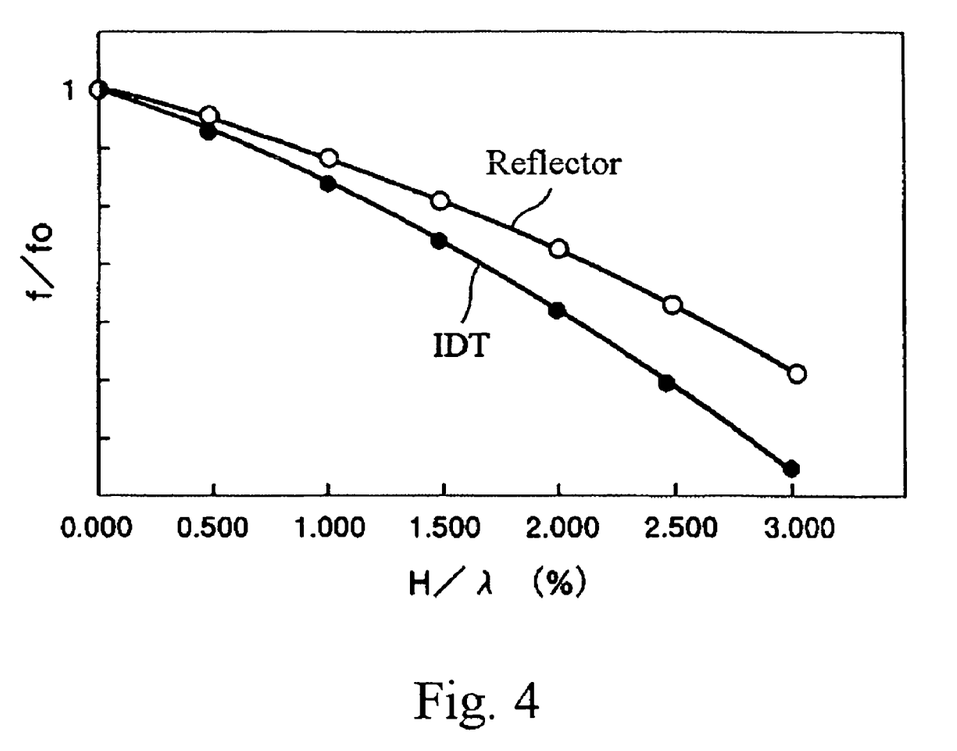
FIG. 4 is a graph showing the relation between the frequency of the surface acoustic wave at the IDT and at the reflector and the film thickness of the IDT and the reflector for a surface acoustic wave element having a piezoelectric substrate of a single layer configuration.

As a reference, a graph showing the dependence (relation) between the frequency of the surface acoustic wave at the IDT and at the reflector and the film thickness of the IDT and the reflector is shown in FIG. 4 for a surface acoustic wave element having a piezoelectric substrate of a single layer configuration.

As shown, when a piezoelectric substrate of a single layer configuration is used, the reduction rate (H/λ) depending upon the film thickness is larger for the frequency of the surface acoustic wave at the IDT as compared with the frequency of the surface acoustic wave at the reflector, contrary to the case shown in FIG. 3.

Accordingly, if the reflecting body pitch is set smaller than the electrode finger pitch, the difference between the frequency of the surface acoustic wave at the IDT and the frequency of the surface acoustic wave at each reflector becomes large on the contrary, thus impairing the impedance characteristic and the insertion loss of the surface acoustic wave element.

In short, the improvement effect due to setting the reflecting body pitch to be smaller than the electrode finger pitch is a peculiar effect as seen in the case of the surface acoustic wave element 1 having a multilayer configuration in which at least a piezoelectric layer is formed on the substrate.

Second Embodiment

Next, a second embodiment of the surface acoustic wave element according to this invention will be described.

Figure 5:
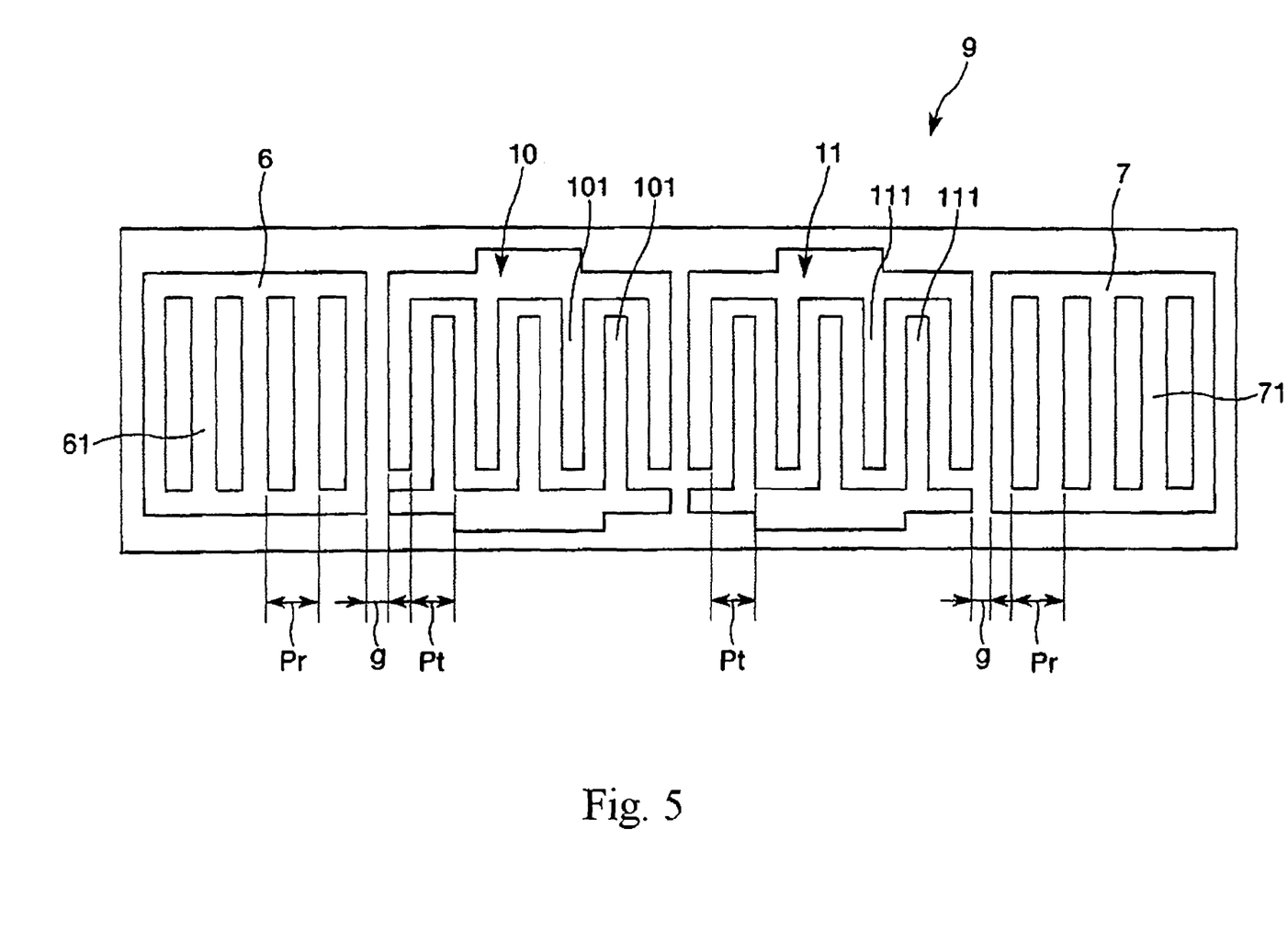
FIG. 5 is a plan view showing the second embodiment of the surface acoustic wave element according to this invention.
Figure 6:
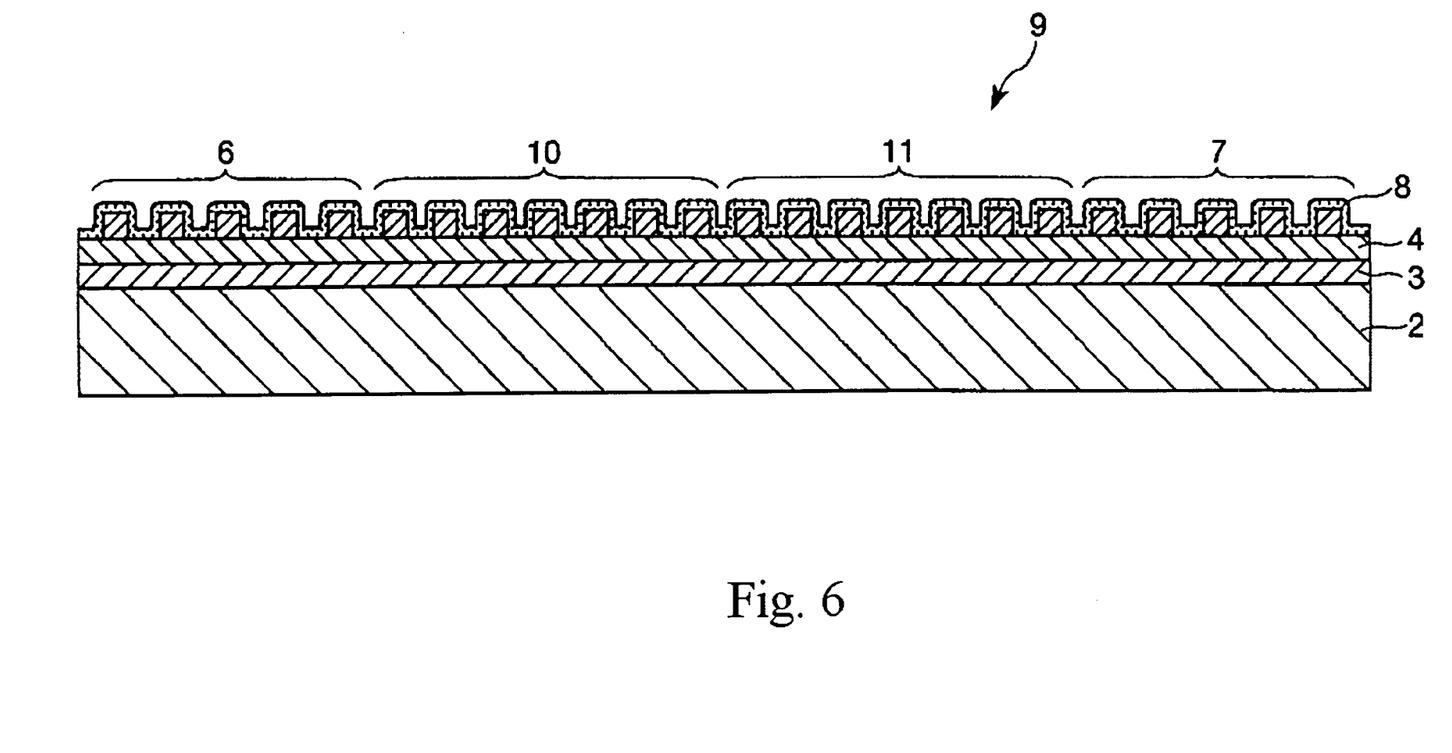
FIG. 6 is a sectional view of the surface acoustic wave element shown in FIG. 5.

FIG. 5 is a plan view showing the second embodiment of the surface acoustic wave element according to this invention, and FIG. 6 is a sectional view of the surface acoustic wave element shown in FIG. 5. In the following description, the upper side and the lower side of FIG. 6 will be referred to "upper" and "lower," respectively.

In the description about a surface acoustic wave element 9 of the second embodiment that follows, a description will be focused on the differences from the surface acoustic wave element 1 of the first embodiment, and a description on similar matters will be omitted.

The surface acoustic wave element 9 of the second embodiment is the same as the first embodiment except for the fact that an IDT 10 for input and an IDT 11 for output are provided in place of the IDT 5 which possesses both of the function of exciting a surface acoustic wave and the function of converting the surface acoustic wave into an electrical signal.

The input side electrode IDT 10 has a function of exciting a surface acoustic wave in the piezoelectric layer 4 when a voltage is applied to the piezoelectric layer 4, whereas the output side electrode IDT 11 has a function of detecting a surface acoustic wave propagating on the piezoelectric layer 4, and outputting the surface acoustic wave by converting it into an electrical signal.

In other words, when a drive voltage is input to the IDT 10, a surface acoustic wave is excited in the piezoelectric layer 4, and an electrical signal with a specific frequency due to resonance is output from the IDT 11.

The IDTs 10 and 11 have respectively an interdigital structure having pluralities of electrode fingers 101 and 111 juxtaposed with prescribed spacing, and by adjusting the width, spacing, pitch, thickness or the like of the electrode fingers 101 and 111 of respective IDTs 10 and 11, it is possible to set the characteristics such as the frequencies of the surface acoustic waves to desired values.

In the second embodiment, the reflecting body pitch Pr of respective reflectors 6 and 7 is set smaller than the electrode finger pitch Pt of respective IDTs 10 and 11. With this setting, the frequencies of the surface acoustic waves at the respective IDTs 10 and 11, and the frequencies of the surface acoustic waves at the respective reflectors 6 and 7 can be made almost equal, so that an improvement on the impedance characteristic and the insertion loss can be realized in the surface acoustic wave element 9.

In this manner, action and effect similar to the surface acoustic wave element 1 of the first embodiment can be obtained also in the surface acoustic wave element 9 of the second embodiment.

The surface acoustic wave elements 1 and 9 as described in the above can be applied to various kinds of electronic equipment to obtain electronic equipment of high reliability.

Next, based on embodiments shown in FIGS. 7 to 9, electronic equipment provided with the surface acoustic wave elements of this invention will be described in detail.

Figure 7:
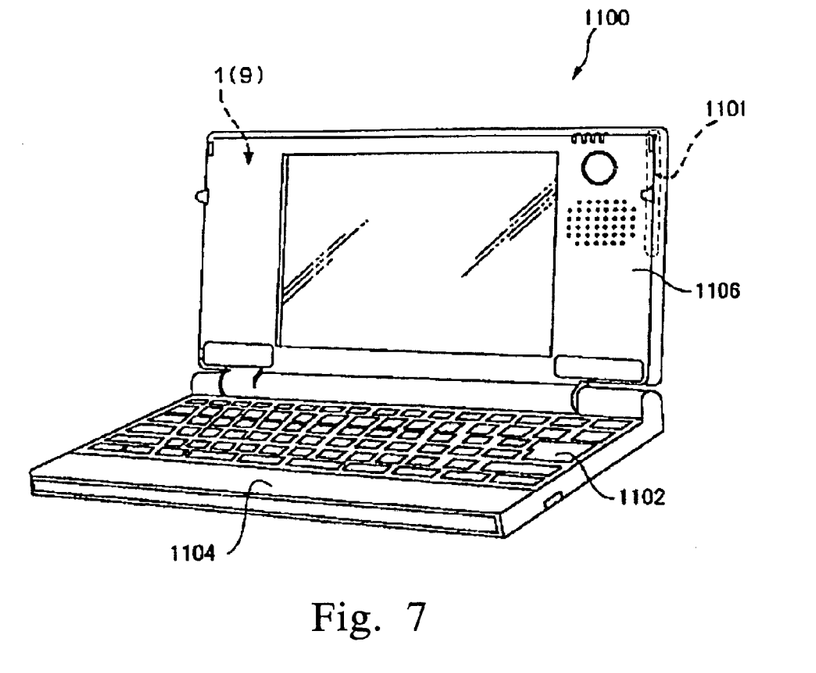
FIG. 7 is electronic equipment (notebook type personal computer) provided with the surface acoustic wave element of the present invention.

FIG. 7 is a perspective view showing the configuration of a mobile (or notebook type) personal computer which is one example of electronic equipment provided with the surface acoustic wave element of this invention.

In the figure, a personal computer 1100 comprises a computer body 1104 equipped with an antenna 1101 and a keyboard 1102, and a display unit 1106, and the display unit 1106 is supported turnably by the computer body 1104 via a hinge mechanism.

In the personal computer 1100, the surface acoustic wave element 1 (or 9) that functions as a filter, a resonator, a reference clock, or the like is built in.

Figure 8:
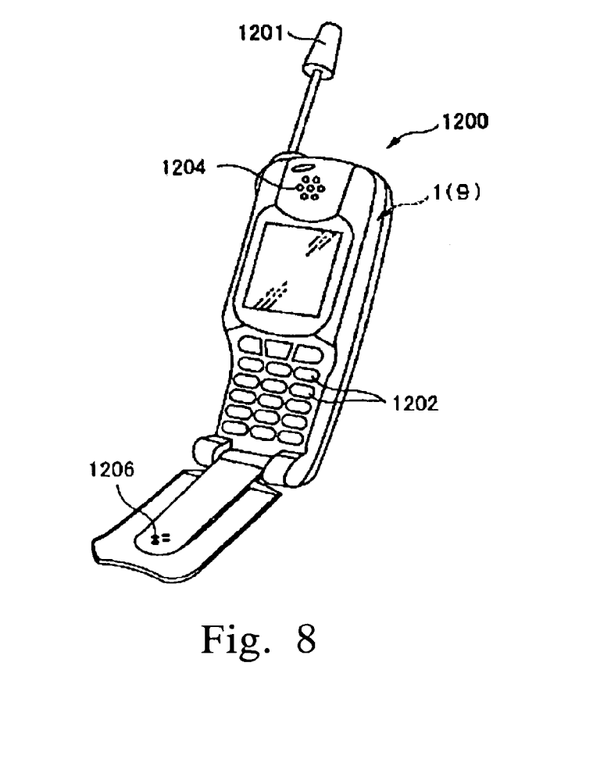
FIG. 8 is electronic equipment (mobile telephone) provided with the surface acoustic wave element of the present invention.

FIG. 8 is a perspective view showing the configuration of a mobile telephone (including a PHS) which is another example of electronic equipment provided with the surface acoustic wave element of this invention.

In the figure, a mobile telephone 1200 is provided with an antenna 1201, a plurality of operation buttons 1202, an ear piece 1204 and a mouth piece 1206, and a display part is arranged between the operation buttons 1202 and the ear piece 1204.

In the mobile telephone 1200, the surface acoustic wave element 1 (or 9) functioning as a filter, a resonator, or the like is built in.

Figure 9:
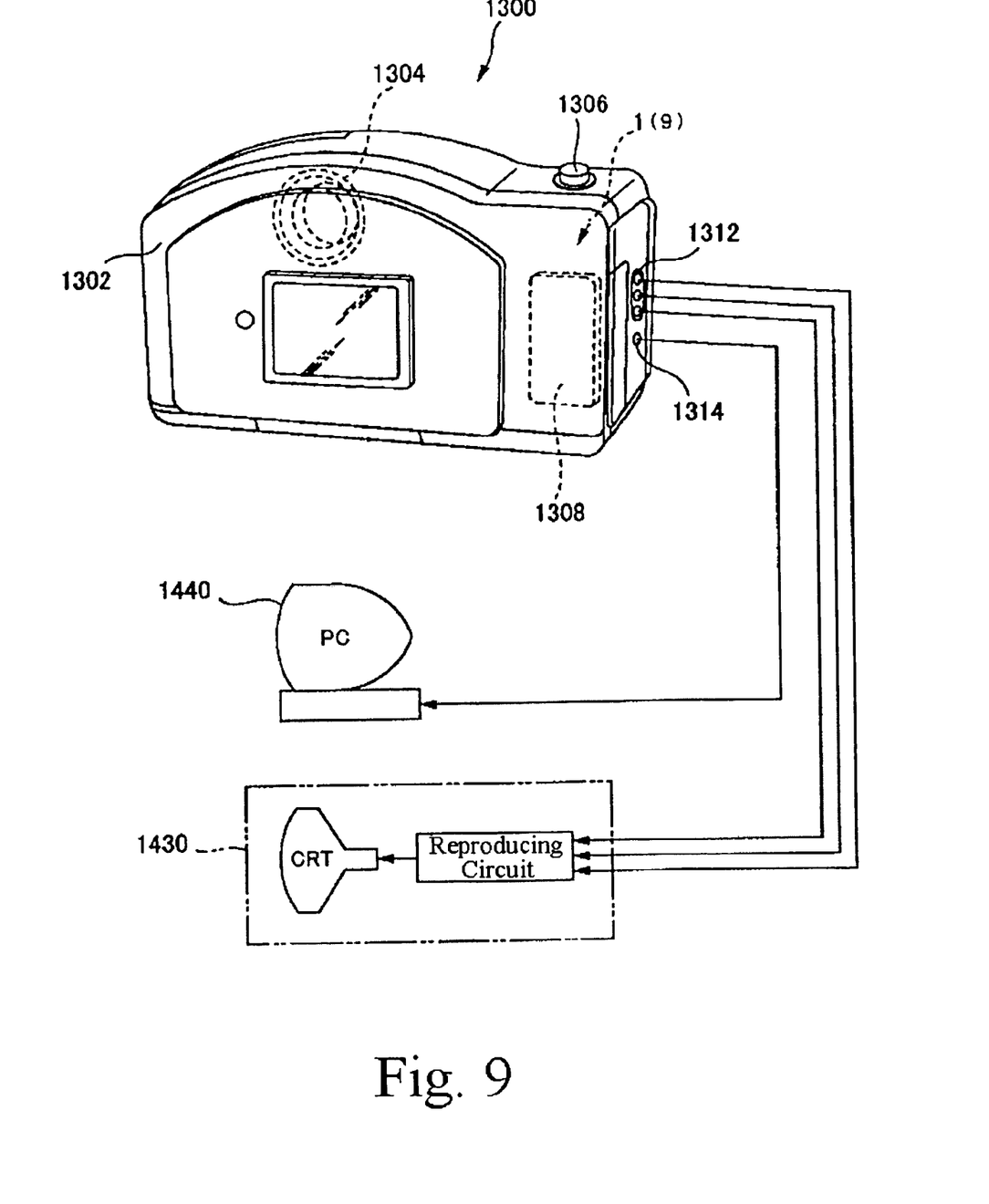
FIG. 9 is electronic equipment (digital still camera) provided with the surface acoustic wave element of the present invention.

FIG. 9 is a perspective view showing the configuration of a digital still camera which is other example of electronic equipment provided with the acoustic wave element according to this invention. In the figure, the connection with external equipment is shown in a simplified manner.

Here, in contrast to the ordinary camera in which the silver salt photographic film is photosensitized by the optical image of an object, in a digital still camera 1300 an imaged signal (picture signal) is created by photoelectrically converting the optical image of the object by an imaging element such as a CCD (charge coupled device).

A display part provided on the back face of a case (body) 1302 of the digital still camera 1300 performs display based on the signal imaged by the CCD, and the display part functions as a finder which displays the object as an electronic image.

A light receiving unit 1304 which includes an optical lens (imaging optics), the CCD, and the like are provided on the front side (back side of the figure) of the case 1302.

When a photographer confirms the object image displayed on the display part, and depresses the shutter button 1306, the imaging signal of the CCD at that moment is transferred to a memory 1308 and is stored therein.

In the digital still camera 1300, a video signal output terminal 1312 and an input/output terminal 1314 are provided on a side face of the case 1302. Besides, as shown in the figure, a television monitor 1430 and a personal computer 1440 are connected to the video signal output terminal 1312 and the input/output terminal 1314 for data communication, respectively, as needed. Moreover, the system is configured such that imaged signals stored in the memory 1308 are output to the television monitor 1430 or the personal computer 1440 by a prescribed operation.

In the digital still camera 1300, there is built in the surface acoustic wave element 1 (or 9) to function as a filter or a resonator.

Other examples of the electrical equipment provided with the surface acoustic wave element according to the present invention include, in addition to the personal computer (mobile personal computer) in FIG. 7, the mobile telephone in FIG. 8 and the digital still camera in FIG. 9, an ink jet discharge device (for example, ink jet printer), laptop personal computer, television receiver, video camera, video tape recorder, car navigation device, pager, electronic notebook (including one with communication function), electronic dictionary, desktop calculator, electronic game machine, word processor, work station, video telephone, crime prevention video monitor, electronic binocular, POS terminal, medical equipment (for example, electronic clinical thermometer, blood pressure gauge, blood sugar meter, electrocardiogram measurement instrument, ultrasonic diagnostic equipment and electronic endoscope), fish finder, various kinds of measurement equipment, instruments (for example, instruments for train, aircraft and ship), flight simulator, or the like.

In the above, the surface acoustic wave element and electronic equipment according to the present invention have been described based on the illustrated embodiments, but the application of the present invention is not limited to these.

For example, in this invention, arbitrary two or more features in the configurations of the first and second embodiments may be combined.

Moreover, the surface acoustic wave element of the present invention may further be provided with a temperature compensation film that has a function of improving the temperature characteristic.

Moreover, an intermediate layer of an arbitrary purpose may be provided between various layers constituting the surface acoustic wave element of the present invention.

Furthermore, the surface acoustic wave element of the present invention may be compounded with semiconductor elements having various functions.

EXAMPLES

Hereinafter, specific examples of the present invention will be described.

Example 1

First, a silicon substrate having the average thickness of 0.4 mm was prepared as the substrate.

Then, a diamond layer (intermediate layer) having the average thickness of 10 µm and a zinc oxide layer (piezoelectric layer) having the average thickness of 400 nm were formed on the substrate by laminating them sequentially. Here, the average thickness of the zinc oxide layer was 0.1 time the wavelength of the surface acoustic wave.

Next, aluminum was adhered to the zinc oxide layer by vacuum deposition to form a conductive material layer having the average thickness of 40 nm.

Next, a resist film corresponding to the shapes of the IDT and the reflectors were formed on the conductive material layer.

Next, the IDT and the reflectors were formed by removing unnecessary portions of the conductive material layer by dry etching using the resist film as a mask.

Here, the wavelength of the surface acoustic wave, the electrode finger pitch Pt of the IDT and the reflecting body pitch Pr of the reflector were set to 4 µm, 2 µm and 1.97 µm, respectively, with Pr/Pt=0.985. Moreover, the separation distance g between the IDT and the respective reflectors was set to 1 µm (0.25 time the wavelength of the surface acoustic wave).

Next, after removal of the resist layer, a silicon oxide layer (protective layer) of average thickness 400 nm was formed on the zinc oxide layer by adhering silicon oxide ($SiO_2$) by CVD or PVD so as to cover the IDT and the reflectors, obtaining the surface acoustic wave element as shown in FIG. 1 and FIG. 2.

Example 2

The surface acoustic wave element as shown in FIG. 5 and FIG. 6 was obtained in a manner similar to the first example except for the formation of the IDT for input and the IDT for output.

Here, the electrode finger pitch Pt for the IDTs, the reflecting body pitch Pr for the reflectors and the separation distance g between the IDT and the reflector were set respectively to be the same as in the example 1.

Comparative Example 1

A surface acoustic wave element was obtained in a manner similar to example 1 except for the electrode finger pitch Pt of the IDT and the reflecting body pitch Pr of the reflector were set to 2 µm, respectively, and the separation distance g between the IDT and the reflector was set to 1 µm.

Comparative Example 2

A surface acoustic wave element was obtained in a manner similar to example 2 except for the electrode finger pitch Pt of the IDT and the reflecting body pitch Pr of the reflector were set to 2 µm, respectively, and the separation distance g between the IDT and the reflector wasiset 1 µm.

Quality/Properties Evaluation (Evaluation 1)

The impedance characteristic was examined for the surface acoustic wave elements prepared respectively for the Example 1 and the Comparative example 1.

Figure 10:
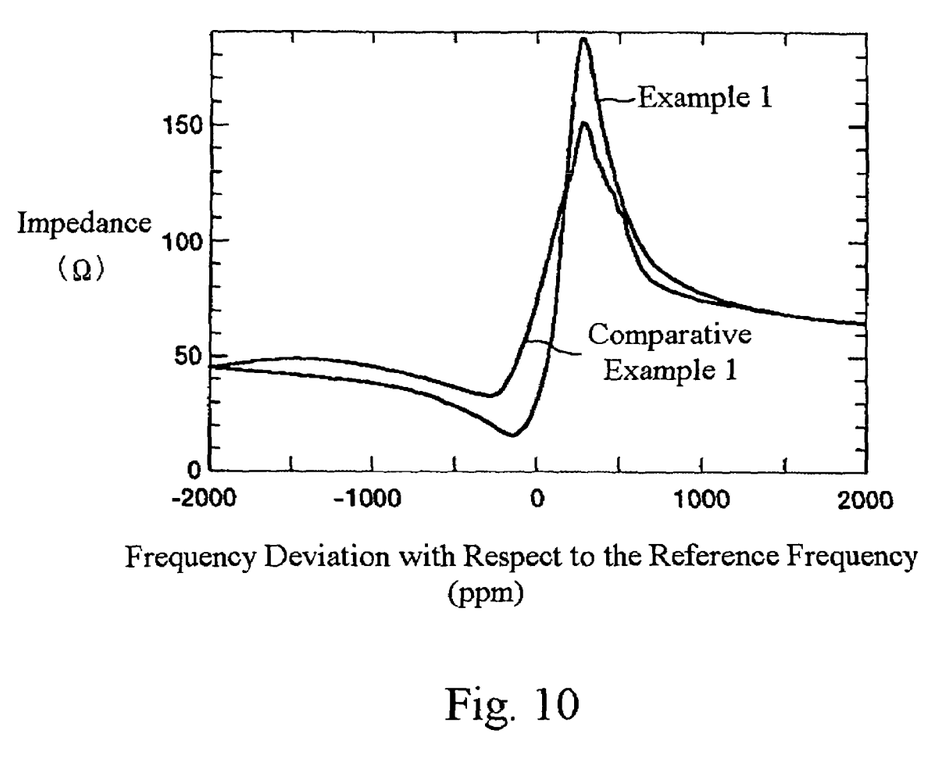
FIG. 10 is a graph showing the impedance characteristic of the surface acoustic wave element manufactured in each of the Example 1 and the Comparative Example 1.

The result is shown in FIG. 10. In FIG. 10, the abscissa represents the frequency deviation with respect to the reference frequency, and the ordinate represents the impedance.

As shown in FIG. 10, the surface acoustic wave element of the Example 1 of this invention realizes an improvement on the impedance characteristic as compared with the surface acoustic wave device of the Comparative example 1.

(Evaluation 2)

The insertion loss (energy loss) was examined for the surface acoustic wave elements prepared for the Example 2 and the Comparative example 2.

Figure 11:
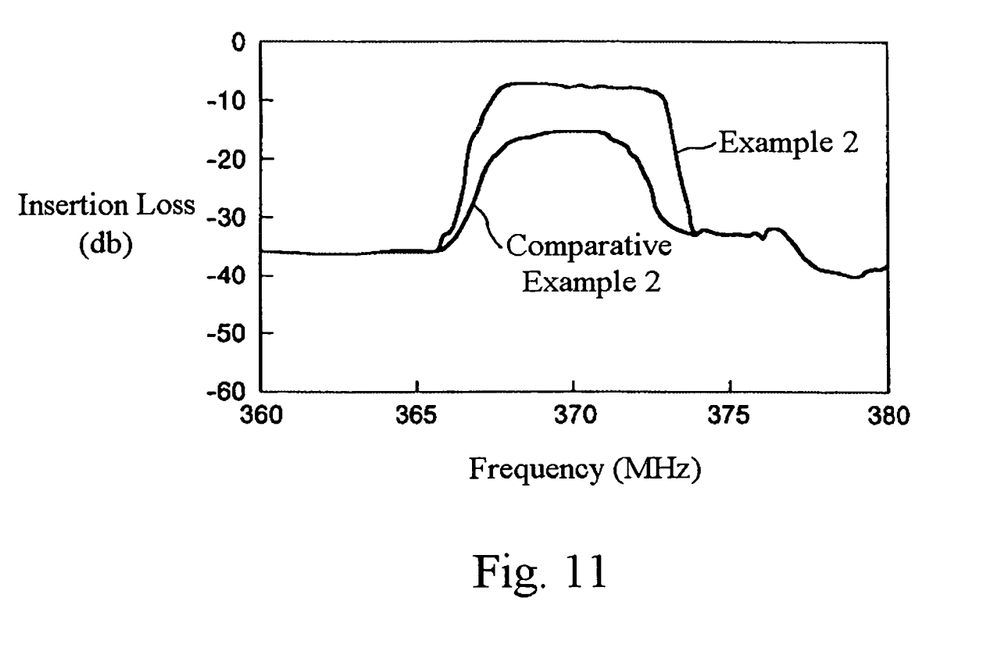
FIG. 11 is a graph showing the insertion loss (energy loss) of the surface acoustic wave elements manufactured in each of the Example 2 and the Comparative Example 2.

The result is shown in FIG. 11. In FIG. 11, the abscissa represents the frequency of the surface acoustic wave, and the ordinate represents the insertion loss.

As shown in FIG. 11, the surface acoustic wave element of the Example 2 of this invention realizes an improvement on the insertion loss as compared with the surface acoustic wave device of the Comparative example 2.

Moreover, a surface acoustic wave element was prepared similar to the Example 1 and the Example 2 by forming a zinc oxide layer on the crystalline quartz substrate, and forming the IDTs and the reflectors on the zinc oxide layer to examine the impedance characteristic and the insertion loss.

The result was similar to the results of the Example 1 and the Example 2.

Finally, it is to be noted that the present invention is not limited to the embodiments and examples described above, and many changes and additions may be made without departing from the scope of the present invention which is defined by the following claims.

The entire disclosure of Japanese Patent Application No. 2003-307371 filed Aug. 29, 2003 is incorporated by reference.

What is claimed is:

1. A surface acoustic wave element, comprising:
a substrate formed of a material selected from the group consisting of semiconductor material, crystalline quartz, glass, ceramic, and resin;
a piezoelectric layer arranged on the substrate and mainly formed of a piezoelectric material;
an intermediate layer provided between the piezoelectric layer and the substrate for setting the characteristics of the surface acoustic waves excited in the piezoelectric layer, the intermediate layer being formed of a material which contains as a major component thereof at least one material selected from the group consisting of diamond, silicon, silicon nitride, glass, crystalline quartz, lithium tantalate and potassium niobate;

an interdigital transducer arranged on the piezoelectric layer for at least one of:
converting an electrical signal into a surface acoustic wave; and
converting a surface acoustic wave into an electrical signal,
and the interdigital transducer including a plurality of electrode fingers juxtaposed with a prescribed spacing; and a reflector arranged adjacent to the interdigital transducer on the piezoelectric layer, the first reflector including a plurality of reflecting bodies juxtaposed with a prescribed spacing, wherein a pitch of the reflecting body of the reflector is smaller than a pitch of the electrode finger of the interdigital transducer;

wherein an average thickness of the substrate is in a range of 0.1 to 0.8 mm.

2. The surface acoustic wave element as claimed in claim 1, wherein when the pitch of the electrode finger of the interdigital transducer and the pitch of the reflecting body of the reflector are defined as Pt (μm) and Pr (μm), respectively, the ratio Pr/Pt is in the range of 0.7 to 0.9995.

3. The surface acoustic wave element as claimed in claim 1, wherein a thickness of the piezoelectric layer is equal to or less than twice a wavelength of the surface acoustic wave to be excited in the piezoelectric layer.

4. The surface acoustic wave element as claimed in claim 1, wherein the piezoelectric layer is formed of a material which contains as a major component thereof at least one material selected from the group consisting of zinc oxide, aluminum nitride, lithium tantalate, lithium niobate and potassium niobate.

5. The surface acoustic wave element as claimed in claim 1, wherein a separation distance between the interdigital transducer and the reflector is in the range of 0.05 to 0.4 time the wavelength of the surface acoustic wave excited in the piezoelectric layer or the sum of this value and an integer multiple of the wavelength.

6. The surface acoustic wave element as claimed in claim 1, further comprising a second reflector, wherein the reflector and the second reflector are arranged on both sides of the interdigital transducer on the piezoelectric layer.

7. The surface acoustic wave element as claimed in claim 6, wherein the configuration of the second reflector is substantially the same as the configuration of the reflector.

8. The surface acoustic wave element as claimed in claim 2,
wherein a ratio Pr/Pt is in a range of 0.8 to 0.9985.

9. The surface acoustic wave element as claimed in claim 1 further comprising a protective layer formed on the interdigital transducer and the reflector, the protective layer being formed of silicon oxide.

10. An electronic equipment provided with the surface acoustic wave element claimed in any one of claims 1 to 3 and 4 to 7.

* * * * *